United States Patent
Yang et al.

(10) Patent No.: US 6,686,255 B2
(45) Date of Patent: Feb. 3, 2004

(54) AMORPHIZING ION IMPLANT LOCAL OXIDATION OF SILICON (LOCOS) METHOD FOR FORMING AN ISOLATION REGION

(75) Inventors: Chi-Ming Yang, Hsin-Chu (TW); Fu-Liang Yang, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 113 days.

(21) Appl. No.: 09/918,010

(22) Filed: Jul. 30, 2001

(65) Prior Publication Data

US 2003/0022461 A1 Jan. 30, 2003

(51) Int. Cl.[7] .................................................. H01L 21/76
(52) U.S. Cl. ...................... 438/439; 438/404; 438/424; 438/435; 438/154; 438/155
(58) Field of Search .................................. 438/439, 404, 438/424, 149, 164, 20, 435, 219, 299, 440, 155, 618, 407, 410, 360, 154

(56) References Cited

U.S. PATENT DOCUMENTS

| | | | |
|---|---|---|---|
| 4,728,619 A | | 3/1988 | Pfiester et al. |
| 5,164,806 A | * | 11/1992 | Nagatomo et al. .......... 257/395 |
| 5,763,316 A | * | 6/1998 | Chen et al. .................. 438/446 |
| 5,895,252 A | * | 4/1999 | Lur et al. .................... 438/423 |
| 6,030,863 A | | 2/2000 | Chang et al. |
| 6,037,204 A | | 3/2000 | Chang et al. |
| 6,127,242 A | * | 10/2000 | Batra et al. ................. 438/440 |

* cited by examiner

*Primary Examiner*—Matthew Smith
*Assistant Examiner*—Igwe U. Anya
(74) *Attorney, Agent, or Firm*—Tung & Associates

(57) ABSTRACT

Within a local oxidation of silicon (LOCOS) method for forming a silicon oxide isolation region, there is first amorphized areally completely at least a surface sub-layer portion of a silicon layer within an isolation region location within the silicon layer defined by an oxidation mask layer formed over the silicon layer, to form an amorphized silicon region within the isolation region location. Thus, when thermally oxidizing the silicon layer having formed thereover the oxidation mask layer to form at least in part from the amorphized silicon region a silicon oxide isolation region, the silicon oxide isolation region is formed with an attenuated bird's beak extension.

14 Claims, 1 Drawing Sheet

AMORPHIZING ION IMPLANT LOCAL OXIDATION OF SILICON (LOCOS) METHOD FOR FORMING AN ISOLATION REGION

BACKGROUND OF THE INVENTION

1. Field of the Invention

The present invention relates generally to methods for forming isolation regions within semiconductor substrates. More particularly, the present invention relates to local oxidation of silicon (LOCOS) methods for forming silicon oxide isolation regions within silicon semiconductor substrates.

2. Description of the Related Art

Semiconductor integrated circuit microelectronic fabrications are formed from semiconductor substrates within an upon which are formed semiconductor devices and over which are formed patterned conductor layers which are separated by dielectric layers.

In the process of fabricating semiconductor devices within and upon semiconductor substrates employed within semiconductor integrated circuit microelectronic fabrications, it is common in the art of semiconductor integrated circuit microelectronic fabrication to first form within a semiconductor substrate within which is desired to form a series of semiconductor devices a series of isolation regions for purposes of isolating the series of semiconductor devices such as to reduce detrimental effects, such as but not limited to detrimental parasitic effects and detrimental crosstalk effects, when operating a semiconductor integrated circuit microelectronic fabrication formed from the semiconductor substrate having formed therein the semiconductor devices. Of the types of isolation regions which may be employed when fabricating semiconductor integrated circuit microelectronic fabrications, silicon oxide isolation regions formed employing local oxidation of silicon (LOCOS) thermal oxidation methods are particularly common in the art of silicon semiconductor integrated circuit microelectronic fabrication.

While local oxidation of silicon (LOCOS) methods for forming silicon oxide isolation regions within and upon silicon semiconductor substrates are thus clearly desirable in the art of silicon semiconductor integrated circuit microelectronic fabrication and often essential within the art of silicon semiconductor integrated circuit microelectronic fabrication, local oxidation of silicon (LOCOS) methods for forming silicon oxide isolation regions within and upon silicon semiconductor substrates are nonetheless not entirely without problems in the art of silicon semiconductor integrated circuit microelectronic fabrication. In that regard, it is known in the art of silicon semiconductor integrated circuit microelectronic fabrication that when forming silicon oxide isolation regions while employing local oxidation of silicon (LOCOS) methods there is often formed beneath a local oxidation of silicon (LOCOS) oxidation mask layer a bird's beak extension of a silicon oxide isolation region. The bird's beak extension of the silicon oxide isolation region in turn generally compromises an areal dimension of an active region of a semiconductor substrate which is bounded by the silicon oxide isolation region.

It is thus desirable in the art of silicon semiconductor integrated circuit microelectronic fabrication to provide methods and materials which may be employed for forming, with attenuated bird's beak extensions, silicon oxide isolation regions within silicon semiconductor substrates employed within silicon semiconductor integrated circuit microelectronic fabrications.

It is towards the foregoing object that the present invention is directed.

Various methods and materials have been disclosed in the art of silicon semiconductor integrated circuit microelectronic fabrication for forming, with desirable properties, silicon containing structures within silicon semiconductor integrated circuit microelectronic fabrications.

Included among the methods and materials, but not limiting among the methods and materials, are methods and materials disclosed within: (1) Pfiester et al., in U.S. Pat. No. 4,728,619 (an ion implant method which employs a germanium ion implant material in conjunction with a boron ion implant material or a phosphorus ion implant material for purposes of controlling the dimensions of a boron ion implant channel stop structure or a phosphorus ion implant channel stop structure within a silicon semiconductor substrate employed within a silicon semiconductor integrated circuit microelectronic fabrication when forming while employing a local oxidation of silicon (LOCOS) method a silicon oxide isolation region within the silicon semiconductor substrate); and (2) Chang et al., in U.S. Pat. No. 6,030,863 and U.S. Pat. No. 6,037,204 (an ion implant method which employs in an alternative a germanium and arsenic ion implant material or a silicon and arsenic ion implant material for preamorphizing a silicon layer within a silicon semiconductor integrated circuit microelectronic fabrication prior to forming thereupon a metal silicide layer while employing a thermal annealing method within the silicon semiconductor integrated circuit microelectronic fabrication).

Desirable in the art of silicon semiconductor integrated circuit microelectronic fabrication are additional methods and materials which may be employed for forming within silicon semiconductor substrates, and while employing local oxidation of silicon (LOCOS) methods, silicon oxide isolation regions with attenuated bird's beak extensions.

It is towards the foregoing object that the present invention is directed.

SUMMARY OF THE INVENTION

A first object of the present invention is to provide a local oxidation of silicon (LOCOS) method for forming a silicon oxide isolation region within a silicon semiconductor substrate.

A second object of the present invention is to provide a local oxidation of silicon (LOCOS) method in accord with the first object of the present invention, wherein the silicon oxide isolation region is formed with an attenuated bird's beak extension.

A third object of the present invention is to provide a location oxidation of silicon (LOCOS) method in accord with the first object of the present invention and the second object of the present invention, wherein the method is readily commercially implemented.

In accord with the objects of the present invention, there is provided by the present invention a local oxidation of silicon (LOCOS) method for forming a silicon oxide isolation region within a silicon semiconductor substrate.

To practice the method of the present invention, there is first provided a silicon semiconductor substrate. There is then formed over the silicon semiconductor substrate an oxidation mask layer which leaves uncovered an isolation region location within the silicon semiconductor substrate.

There is then implanted into the isolation region location, while employing the oxidation mask layer as an ion implantation mask layer, a dose of an amorphizing ion which amorphizes areally completely at least a surface sub-layer portion of the silicon semiconductor substrate within the isolation region location to form an amorphized silicon region within the isolation region location. Finally, there is then thermally oxidized the silicon semiconductor substrate having formed thereover the oxidation mask layer to form at least in part from the amorphized silicon region a silicon oxide isolation region.

In a more general sense, the present invention also provides a local oxidation of silicon (LOCOS) method for forming within a microelectronic fabrication an isolation region adjoining a silicon layer formed from a silicon material selected from the group consisting of monocrystalline silicon materials and polycrystalline silicon materials, with an attenuated bird's beak extension of the isolation region.

In a more specific sense, the present invention also provides particular value within the context of forming, while employing a local oxidation of silicon (LOCOS) method, an isolation region defining at least in part an active region of a silicon surface layer within a silicon on insulator silicon semiconductor substrate.

There is provided by the present invention a local oxidation of silicon (LOCOS) method for forming a silicon oxide isolation region within a silicon semiconductor substrate, wherein the silicon oxide isolation region is formed with an attenuated bird's beak extension.

The present invention realizes the foregoing object by implanting into an isolation region location within a silicon semiconductor substrate having formed thereover an oxidation mask layer, and while employing the oxidation mask layer as an ion implantation mask layer, a dose of an amorphizing ion which amorphizes areally completely at least a surface sub-layer portion of the silicon semiconductor substrate within the isolation region location not covered by the oxidation mask layer, to form an amorphized silicon region within the isolation region location. Thus, when subsequently thermally oxidizing the silicon semiconductor substrate having formed thereover the oxidation mask layer to form at least in part from the amorphized silicon region a silicon oxide isolation region, the silicon oxide isolation region is formed with an attenuated bird's beak extension insofar as an amorphized silicon material within the amorphized silicon region is thermally oxidized more rapidly than a non-amorphized silicon material, such as in particular a monocrystalline silicon material, from which is formed the silicon semiconductor substrate.

The method of the present invention is readily commercially implemented.

The present invention employs methods and materials as are generally conventional in the art of semiconductor integrated circuit microelectronic fabrication, but employed within the context of a specific process ordering and with a series of specific process limitations to provide the present invention. Since it is thus at least in part a specific process ordering and a series of specific process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
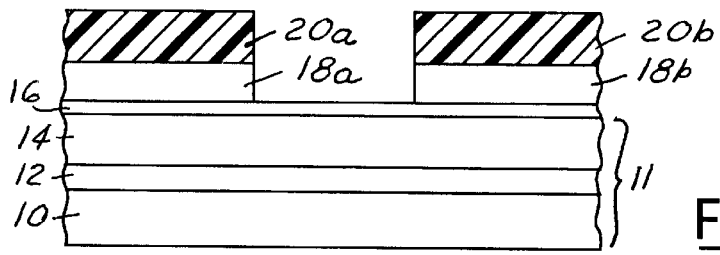
FIG. 1, FIG. 2, FIG. 3 and FIG. 4 show a series of schematic cross-sectional diagrams illustrating the results of progressive stages in forming, in accord with a preferred embodiment of the present invention, an isolation region within a silicon surface layer within a silicon on insulator silicon semiconductor substrate.

The present invention provides a local oxidation of silicon (LOCOS) method for forming a silicon oxide isolation region within a silicon semiconductor substrate, wherein the silicon oxide isolation region is formed with an attenuated bird's beak extension.

The present invention realizes the foregoing object by implanting into an isolation region location within a silicon semiconductor substrate having formed thereover an oxidation mask layer, and while employing the oxidation mask layer as an ion implantation mask layer, a dose of an amorphizing ion which amorphizes areally completely at least a surface sub-layer portion of the silicon semiconductor substrate within the isolation region location to form an amorphized silicon region within the isolation region location. Thus, when subsequently thermally oxidizing the silicon semiconductor substrate having formed thereover the oxidation mask layer to form at least in part from the amorphized silicon region a silicon oxide isolation region, the silicon oxide isolation region is formed with an attenuated bird's beak extension insofar as an amorphized silicon material from which is formed the amorphized silicon region is thermally oxidized more rapidly than the remaining silicon region (which is typically a monocrystalline silicon region) within the silicon semiconductor substrate.

Although the preferred embodiment of the present invention illustrates the present invention most particularly within the context of forming a silicon oxide isolation region within a silicon surface layer within a silicon on insulator silicon semiconductor substrate, the present invention may nonetheless also be employed for forming, with an attenuated bird's beak extension, a silicon oxide isolation region within a silicon semiconductor substrate selected from the group including but not limited to bulk silicon semiconductor substrates and silicon on insulator silicon semiconductor substrates.

Similarly, although the preferred embodiment of the present invention illustrates the present invention most particularly within the context of forming, with an attenuated bird's beak extension, a silicon oxide isolation region within a silicon surface layer within a silicon on insulator silicon semiconductor substrate, the present invention also provides value within the context of forming silicon oxide isolation regions, with attenuated bird's beak extensions, adjoining silicon layers including but not limited to monocrystalline silicon layers and polycrystalline silicon layers, within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 4, there is shown a series of schematic cross-sectional diagrams illustrating the results of progressive stages in forming, in accord with a preferred embodiment of the present invention, a silicon oxide isolation region within a silicon surface layer within a silicon on insulator silicon semiconductor substrate employed for fabricating a silicon semiconductor integrated circuit microelectronic fabrication.

Shown in FIG. 1 is a schematic cross-sectional diagram of the silicon semiconductor integrated circuit microelectronic fabrication at an early stage in its fabrication in accord with the preferred embodiment of the present invention.

Shown in FIG. 1, in a first instance, is a silicon on insulator silicon semiconductor substrate 11 which comprises a bulk silicon semiconductor substrate 10 having formed thereupon a buried isolation layer 12 in turn having formed thereupon a silicon surface layer 14.

Within the preferred embodiment of the present invention with respect to the bulk silicon semiconductor substrate 10, and although bulk silicon semiconductor substrates are known in the art of semiconductor integrated circuit microelectronic fabrication with either dopant polarity, several dopant concentrations and various crystallographic orientations, for the preferred embodiment of the present invention, the bulk silicon semiconductor substrate 10 is typically and preferably provided as an N- or P-bulk silicon semiconductor substrate having a (100) monocrystalline crystallographic orientation.

Within the preferred embodiment of the present invention with respect to the buried isolation layer 12, the buried isolation layer 12 is typically and preferably formed of a silicon oxide dielectric isolation material formed to a thickness of from about to about 10000 angstroms upon the bulk silicon semiconductor substrate 10.

Finally, within the preferred embodiment of the present invention with respect to silicon surface layer 14, the silicon surface layer 14 is typically and preferably also formed of a silicon material analogous or equivalent to the silicon material from which is formed the bulk silicon semiconductor substrate 10. Typically and preferably, the silicon surface layer 14 is formed to a thickness of from about 100 to about 2000 angstroms while also being formed of a (100) monocrystalline silicon semiconductor material.

As is understood by a person skilled in the art, there exist several methods for forming a silicon on insulator silicon semiconductor substrate, such as the silicon on insulator silicon semiconductor substrate 11 as illustrated within the schematic cross-sectional diagram of FIG. 1, including but not limited to oxygen ion implant methods which provide for an in-situ formation of buried isolation layer, such as the buried isolation layer 12 as illustrated within the schematic cross-sectional diagram of FIG. 1, while not compromising the monocrystal characteristics of a bulk silicon semiconductor substrate or a silicon surface layer, such as the bulk silicon semiconductor substrate 10 or the silicon surface layer 14 as illustrated within the schematic cross-sectional diagram of FIG. 1.

Shown also within the schematic cross-sectional diagram of FIG. 1 is: (1) a blanket pad dielectric layer 16 formed upon the silicon surface layer 14, where in turn the blanket pad dielectric layer has formed thereupon; (2) a pair of patterned oxidation mask layers 18a and 18b, which in turn have formed aligned thereupon; (3) a pair of patterned photoresist layers 20a and 20b.

Within the preferred embodiment of the present invention with respect to the blanket pad dielectric layer 16, and although it is known in the art of semiconductor integrated circuit microelectronic fabrication that pad dielectric layers may be formed employing methods including but not limited to pad dielectric layers deposition methods and pad dielectric layer thermal growth methods, for the preferred embodiment of the present invention, the blanket pad dielectric layer 16 is typically and preferably formed of a silicon oxide pad dielectric material formed employing a thermal growth method, to provide the blanket pad dielectric layer 16 of thickness from about 50 to about 300 angstroms formed upon the silicon surface layer 14.

Similarly, within the preferred embodiment of the present invention with respect to the pair of patterned oxidation mask layers 18a and 18b, the pair of patterned oxidation mask layers 18a and 18b is typically and preferably formed at least in part of a silicon nitride oxidation mask material formed to a thickness of from about 500 to about 2000 angstroms upon the blanket pad dielectric layer 16.

As is understood by a person skilled in the art, the pair of patterned oxidation mask layers 18a and 18b defines an aperture which leaves uncovered by the pair of patterned oxidation mask layers 18a and 18b a portion of the silicon surface layer 14 into which it is desired to form an isolation region.

Finally, within the preferred embodiment of the present invention with respect to the pair of patterned photoresist layers 20a and 20b, the pair of patterned photoresist layers 20a and 20b may be formed from any of several photoresist materials as are conventional in the art of semiconductor integrated circuit microelectronic fabrication, including but not limited to photoresist material selected from the general groups of photoresist materials including but not limited to positive photoresist materials and negative photoresist materials. Typically and preferably, each of the pair of patterned photoresist layers 20a and 20b is formed to a thickness of from about 1000 to about 5000 angstroms upon a corresponding patterned oxidation mask layer 18a or 18b.

As is understood by a person skilled in the art, and in a first instance, the pair of patterned photoresist layers 20a and 20b is employed as an etch mask layer for forming from a corresponding blanket oxidation mask layer the pair of patterned oxidation mask layers 18a and 18b.

Figure 2:
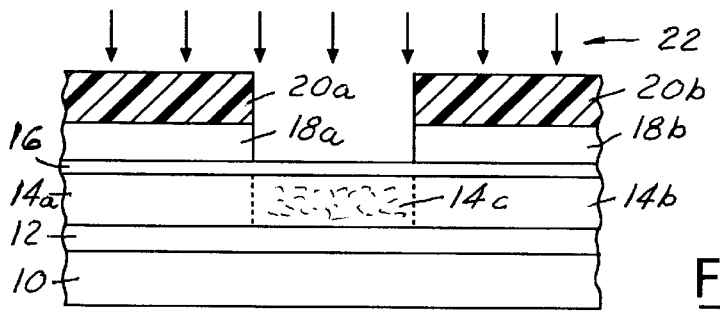

Referring now to FIG. 2, there is shown a schematic cross-sectional diagram illustrating the results of further processing of the silicon semiconductor integrated circuit microelectronic fabrication whose schematic cross-sectional diagram is illustrated in FIG. 1.

Shown in FIG. 2 is a schematic cross-sectional diagram of a silicon semiconductor integrated circuit microelectronic fabrication otherwise equivalent to the silicon semiconductor integrated circuit microelectronic fabrication whose schematic cross-sectional diagram is illustrated in FIG. 1, but wherein there is implanted into the silicon surface layer 14, while employing at least the pair of patterned oxidation mask layers 18a and 18b as an ion implantation mask, a dose of amorphizing implanting ions 22 to form from the silicon surface layer 14 a pair of patterned silicon surface layers 14a and 14b which is separated by an amorphized silicon region 14c. Within FIG. 2, the amorphized silicon region 14c is formed interposed between the pair of patterned oxidation mask layers 18a and 18b and aligned beneath a pair of edges of the pair of patterned oxidation mask layers 18a and 18b. While within the preferred embodiment of the present invention as illustrated within the schematic cross-sectional diagram of FIG. 2 the silicon surface layer 14 has been completely amorphized therethrough within the amorphized silicon region 14c, such is not absolutely required within the present invention (although such is preferred within the preferred embodiment of the present invention). In that regard, however, it is required within the present invention that a dose of amorphizing implanting ions amorphizes areally completely at least a surface sub-layer portion of a silicon layer within an isolation region location defined by an oxidation mask layer, even if the amorphized silicon region does not reach completely through the silicon layer.

Within the preferred embodiment of the present invention with respect to the dose of amorphizing implanting ions 22, the dose of amorphizing implanting ions 22 may be provided employing amorphizing implanting ions selected from the group including but not limited to silicon, germanium, arsenic, argon and oxygen amorphizing implanting ions, or other amorphizing implanting ions having an atomic weight of greater than about 50 amu and more typically and preferably from about 50 to about 200 amu, typically and preferably provided at an amorphizing ion implantation dose of from about $1 \times 10^{14}$ to about $1 \times 10^8$ amorphizing implanting ions per square centimeter and at a varied ion implantation energy spanning a range of from about 50 to about 1000 kev, to completely amorphize the portion of the silicon surface layer 14 not covered by the pair of oxidation mask layers 18a and 18b to a depth which reaches the buried isolation layer 12.

Figure 3:
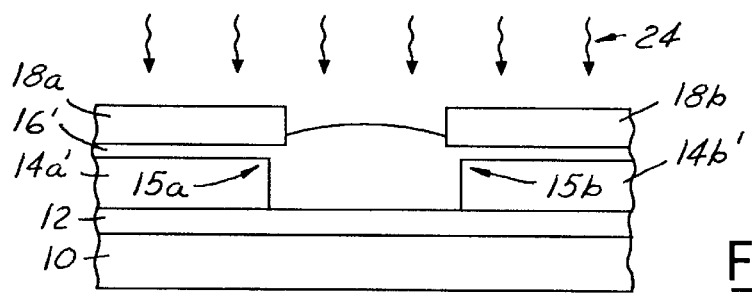

Referring now to FIG. 3, there is shown a schematic cross-sectional diagram illustrating the results of further processing of the silicon semiconductor integrated circuit microelectronic fabrication whose schematic cross-sectional diagram is illustrated in FIG. 2.

Shown in FIG. 3 is a schematic cross-sectional diagram of a silicon semiconductor integrated circuit microelectronic fabrication otherwise equivalent to the silicon semiconductor integrated circuit microelectronic fabrication whose schematic cross-sectional diagram is illustrated in FIG. 2, but wherein the silicon on insulator silicon semiconductor substrate has been thermally annealed within an oxidizing thermal annealing atmosphere 24, to form from the amorphized silicon region 14c, and in conjunction with the blanket pad dielectric layer 16, a contiguous blanket pad dielectric layer and isolation region 16'. Similarly, incident to thermally annealing the silicon on insulator silicon semiconductor substrate within the oxidizing thermal annealing atmosphere 24, the pair of patterned silicon surface layers 14a and 14b is laterally consumed somewhat to form a pair of laterally consumed patterned silicon surface layers 14a' and 14b'. Typically and preferably the lateral consumption of the pair of patterned silicon surface layers 14a and 14b when forming the pair of laterally consumed patterned silicon surface layers 14a' and 14b' is from about 300 to about 2000 angstroms.

Within the preferred embodiment of the present invention, the oxidizing thermal annealing atmosphere 24 is provided employing either an oxidant containing atmosphere or a steam containing atmosphere at a temperature of from about 700 to about 1000 degrees centigrade for a time period of from about 10 to about 200 minutes, to form from the amorphized silicon region 14c and the blanket pad dielectric layer 16 the corresponding contiguous pad dielectric layer and isolation region 16', while completely consuming the amorphized silicon region 14c to the depth of the buried isolation layer 12.

As is illustrated within the schematic cross-sectional diagram of FIG. 3, and insofar as the amorphized silicon material from which is formed the amorphized silicon region 14c oxidizes more readily and completely that the monocrystalline silicon material from which is formed the pair of patterned silicon surface layers 14a and 14b, there is attenuated formation of a bird's beak extension within the contiguous pad dielectric layer and isolation region 16' which would otherwise result from a more isotropic consumption of the blanket silicon layer 14 were it not in part amorphized to form the amorphized silicon region 14c. Such isotropic consumption of the blanket silicon layer 14 were it not in part amorphized to form the amorphized silicon region 14c would provide for a more ready consumption of a pair of upper edges 15a and 15b of the pair of patterned silicon surface layers 14a and 14b when forming such an enhanced bird's beak extension.

Figure 4:
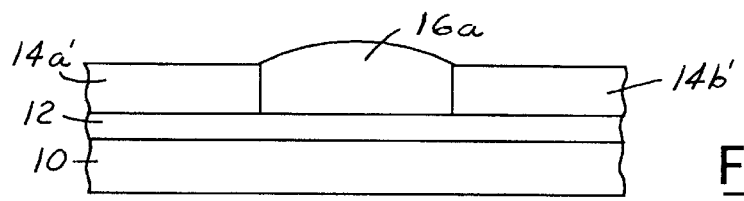

Referring now to FIG. 4, there is shown a schematic cross-sectional diagram illustrating the results of further processing of the silicon semiconductor integrated circuit microelectronic fabrication whose schematic cross-sectional diagram is illustrated in FIG. 3.

Shown in FIG. 4 is a schematic cross-sectional diagram of a silicon semiconductor integrated circuit microelectronic fabrication otherwise equivalent to the silicon semiconductor integrated circuit microelectronic fabrication whose schematic cross-sectional diagram is illustrated in FIG. 3, but wherein, in a first instance, there has been stripped from the silicon semiconductor integrated circuit microelectronic fabrication the pair of patterned oxidation mask layers 18a and 18b.

Within the present invention and the preferred embodiment of the present invention, the pair of patterned oxidation mask layers 18a and 18b may be stripped from the silicon semiconductor integrated circuit microelectronic fabrication whose schematic cross-sectional diagram is illustrated in FIG. 3 to provide in part the silicon semiconductor integrated circuit microelectronic fabrication whose schematic cross-sectional diagram is illustrated in FIG. 4 while employing stripping methods and materials as are otherwise generally conventional in the art of silicon semiconductor integrated circuit microelectronic fabrication. Under circumstances where the pair of patterned oxidation mask layers 18a and 18b is formed at least in part of a silicon nitride material, the pair of patterned oxidation mask layers 18a and 18b is typically and preferably stripped from the silicon semiconductor integrated circuit microelectronic fabrication whose schematic cross-sectional diagram is illustrated in FIG. 3 to provide in part the silicon semiconductor integrated circuit microelectronic fabrication whose schematic cross-sectional diagram is illustrated in FIG. 4 while employing at least in part an aqueous phosphoric acid etchant solution, at an elevated temperature.

Finally, there is also shown within the schematic cross-sectional diagram of FIG. 4 the results of stripping from the silicon semiconductor integrated circuit microelectronic fabrication whose schematic cross-sectional diagram is illustrated in FIG. 3 a blanket pad dielectric layer portion of the contiguous pad dielectric layer and isolation region 16' to leave remaining within the silicon semiconductor integrated circuit microelectronic fabrication whose schematic cross-sectional diagram is illustrated in FIG. 4 the pair of laterally consumed patterned silicon surface layers 14a' and 14b', which provides a pair of active regions of the silicon semiconductor integrated circuit microelectronic fabrication, and which are now separated by an isolation region 16a.

Within the present invention and the preferred embodiment of the present invention, the blanket pad dielectric layer portion of the contiguous pad dielectric layer and isolation region 16' whose schematic cross-sectional diagram is illustrated in FIG. 3 may be stripped therefrom to provide in part the silicon semiconductor integrated circuit microelectronic fabrication whose schematic cross-sectional diagram is illustrated in FIG. 4 while employing stripping methods as are also conventional in the art of silicon semiconductor integrated circuit microelectronic fabrication, wherein such stripping methods will typically and preferably employ aqueous fluoride containing stripping materials.

Upon forming the silicon semiconductor integrated circuit microelectronic fabrication whose schematic cross-sectional diagram is illustrated in FIG. 4, there is formed in accord with a preferred embodiment of the present invention a silicon on insulator silicon semiconductor integrated circuit microelectronic fabrication having formed within a silicon surface layer formed therein an isolation region formed employing a local oxidation of silicon (LOCOS) method, with an attenuated bird's beak extension of the isolation region. The present invention realizes the foregoing object by amorphizing a portion of the silicon surface layer within which is formed the isolation region by first implanting into that portion of the silicon surface layer an amorphizing implanting ion, prior to thermally oxidizing the silicon on insulator silicon semiconductor substrate within an oxidizing thermal annealing atmosphere, to form in part from the amorphized silicon region an isolation region.

EXAMPLE

In order to illustrate the value and validity of the present invention, there was obtained a series of silicon semiconductor substrates and implanted into the series of silicon semiconductor substrates a series of doses of germanium amorphizing implanting ions. The doses spanned a range of from about 2.0E15 to about 1.4E16, and were supplied at an ion implantation energy of about 70 kev.

Each of the series of silicon semiconductor substrates was then thermally oxidized at a temperature of about 800 degrees centigrade for a time period of about 30 minutes within an oxygen and hydrogen oxidizing atmosphere to grow a series of silicon oxide layers upon the series of silicon semiconductor substrates. The thicknesses of the series of silicon oxide layers was then measured employing methods as are otherwise conventional in the art of semiconductor integrated circuit microelectronic fabrication.

Figure 5:
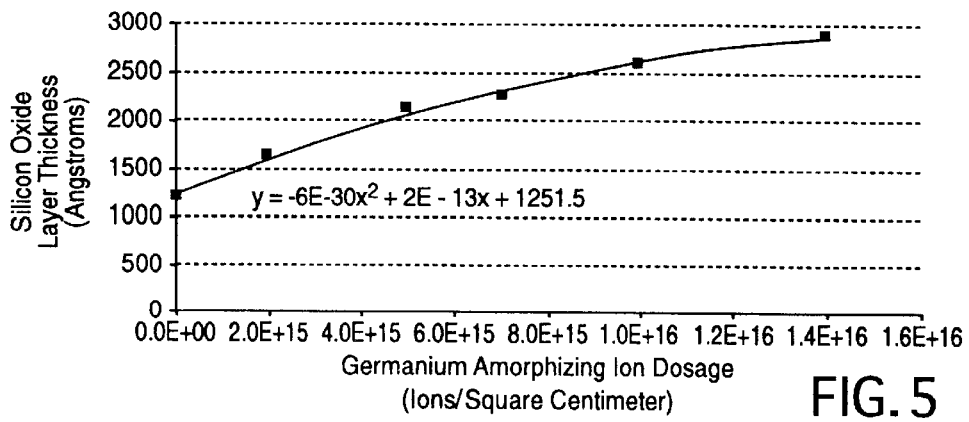
FIG. 5 shows a plot of Silicon Oxide Layer Thickness versus Germanium Amorphizing Ion Dosage in accord with a series of examples of the present invention.

Shown in FIG. 5 is a graph of Silicon Oxide Layer Thickness versus Germanium Amorphizing Ion Dosage, for the series of silicon oxide layers formed upon the series of silicon semiconductor substrates as described above. As is clearly illustrated within the graph of FIG. 5, increasing germanium amorphizing ion dosage provides for increased oxidation rates and increased silicon oxide layer thicknesses, which thus inherently if not explicitly provide within the context of the present invention for forming silicon oxide isolation regions with attenuated bird's beak extensions.

As is understood by a person skilled in the art, the preferred embodiment of the present invention is illustrative of the present invention rather than limiting of the present invention. Revisions and modifications may be made to methods, materials, structures and dimensions through which is provided an isolation region in accord with the preferred embodiment of the present invention while still providing a method for forming an isolation region in accord with the present invention, further in accord with the accompanying claims.

What is claimed is:

1. A local oxidation of silicon (LOCOS) method for forming a silicon oxide isolation region comprising:
   providing a substrate;
   forming over the substrate a silicon layer formed from a silicon material selected from the group consisting of monocrystalline silicon materials and polycrystalline silicon materials;
   forming over the silicon layer an pair of patterned oxidation mask layers which leaves uncovered an isolation region location within the silicon layer;
   implanting into the isolation region location, while employing the oxidation mask layers as an ion implantation mask layer, a dose of an amorphizing ion which amorphizes areally completely at least a surface sub-layer portion of the silicon layer within the isolation region location to form an amorphized silicon region within the isolation region location, the amorphized silicon region being interposed between and aligned beneath a pair of edges of the pair of patterned oxidation mask layers, the amorphizing ion being selected from the group consisting of silicon, germanium and argon amorphizing ions; and
   thermally oxidizing the silicon layer having formed thereover the oxidation mask layer to form at least in part from the amorphized silicon region a silicon oxide isolation region.

2. The method of claim 1 wherein by amorphizing areally completely at least the surface sub-layer portion of the silicon layer within the isolation region location to form the amorphized silicon region within the isolation region location the silicon oxide isolation region is formed with an attenuated bird's beak extension.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the amorphizing ion is provided at an ion implant dose of from about $1 \times 10^{14}$ to about $1 \times 10^{18}$ ions per square centimeter and an ion implantation energy of from about 50 to about 1000 kev.

5. The method of claim 1 wherein the silicon semiconductor substrate is thermally oxidized at a temperature of from about 700 to about 1000 degrees Centigrade for a time period of from about 10 to about 200 minutes.

6. A local oxidation of silicon (LOCOS) method for forming a silicon oxide isolation region comprising:
   providing a silicon semiconductor substrate;
   forming over the silicon semiconductor substrate a pair of patterned oxidation mask layers which leaves uncovered an isolation region location within the silicon semiconductor substrate;
   implanting into the isolation region location, while employing the oxidation mask layers as an ion implantation mask layer, a dose of an amorphizing ion which amorphizes areally completely at least a surface sub-layer portion of the silicon semiconductor substrate within the isolation region location to form an amorphized silicon region within the isolation region location, the amorphized silicon region being interposed between and aligned beneath a pair of edges of the pair of patterned oxidation mask layers, the amorphizing ion being selected from the group consisting of silicon, germanium and argon amorphizing ions; and thermally oxidizing the silicon semiconductor substrate having formed thereover the oxidation mask layer to form at least in part from the amorphized silicon region a silicon oxide isolation region.

7. The method of claim 6 wherein by amorphizing areally completely at least the surface sub-layer portion of the silicon semiconductor substrate within the isolation region location to form the amorphized silicon region within the isolation region location the silicon oxide isolation region is formed with an attenuated bird's beak extension.

8. The method of claim 6 wherein the silicon semiconductor substrate is selected from the group consisting of bulk silicon semiconductor substrates and silicon an insulator silicon semiconductor substrates.

9. The method of claim 6 wherein the amorphizing ion is provided at an ion implant dose of from about $1 \times 10^{14}$ to about $1 \times 10^{18}$ ions per square centimeter and an ion implantation energy of from about 50 to about 1000 kev.

10. The method of claim 6 wherein the silicon semiconductor substrate is thermally oxidized at a temperature of from about 700 to about 1000 degrees centigrade for a time period of from about 10 to about 200 minutes.

11. A local oxidation of silicon (LOCOS) method for forming a silicon oxide isolation region comprising:

providing a silicon on insulator silicon semiconductor substrate comprising a bulk silicon semiconductor substrate having formed thereover a buried isolation layer having formed thereupon silicon surface layer;

forming over the silicon surface layer a pair of patterned oxidation mask layers which leaves uncovered an isolation region location within the silicon surface layer;

implanting into the isolation region location, while employing the oxidation mask layers as an ion implantation mask layer, a dose of an amorphizing ion which amorphizes areally completely at least a surface sub-layer portion of the silicon surface layer within the isolation region location to form an amorphized silicon region within the isolation region location, the amorphized silicon region being interposed between and aligned beneath a pair of edges of the pair of patterned oxidation mask layers, the amorphizing ion being selected from the group consisting of silicon, germanium and argon amorphizing ions; and thermally oxidizing the silicon surface layer having formed thereover the oxidation mask layer to form at least in part from the amorphized silicon region a silicon oxide isolation region.

12. The method of claim 11 wherein by amorphizing areally completely at least the surface sub-layer portion of the silicon surface layer within the isolation region location to form the amorphized silicon region within the isolation region location the silicon oxide isolation region is formed with an attenuated bird's beak extension.

13. The method of claim 11 wherein the amorphizing ion is provided at an ion implant dose of from about $1 \times 10^{14}$ to about $1 \times 10^{18}$ ions per square centimeter and an ion implantation energy of from about 50 to about 1000 kev.

14. The method of claim 11 wherein the silicon surface layer is thermally oxidized at a temperature of from about 700 to about 1000 degrees centigrade for a time period of from about 10 to about 200 minutes.

* * * * *